US010868575B2

(12) United States Patent
Stählin et al.

(10) Patent No.: US 10,868,575 B2
(45) Date of Patent: Dec. 15, 2020

(54) COMPENSATOR, ELECTRONIC CIRCUIT ASSEMBLY FOR OPERATING AN ANTENNA, AND ANTENNA DEVICE

(71) Applicant: Continental Teves AG & Co. oHG, Frankfurt am Main (DE)

(72) Inventors: Ulrich Stählin, Rochester, MI (US); Marc Menzel, Weimar (DE)

(73) Assignee: Continental Teves AG & Co. oHG

( * ) Notice: Subject to any disclaimer, the term of this patent is extended or adjusted under 35 U.S.C. 154(b) by 0 days.

(21) Appl. No.: 16/484,154

(22) PCT Filed: Feb. 7, 2018

(86) PCT No.: PCT/DE2018/200007
§ 371 (c)(1),
(2) Date: Aug. 7, 2019

(87) PCT Pub. No.: WO2018/149459
PCT Pub. Date: Aug. 23, 2018

(65) Prior Publication Data
US 2020/0007181 A1 Jan. 2, 2020

(30) Foreign Application Priority Data
Feb. 14, 2017 (DE) .......................... 10 2017 202 341

(51) Int. Cl.
*H04B 1/3822* (2015.01)
*H04B 17/10* (2015.01)
(Continued)

(52) U.S. Cl.
CPC ............ *H04B 1/3822* (2013.01); *G01S 19/13* (2013.01); *H02J 13/00009* (2020.01);
(Continued)

(58) Field of Classification Search
CPC .. H04B 1/3822; H04B 17/102; H04B 1/3877; H04B 17/20; H02J 13/00009;
(Continued)

(56) References Cited

U.S. PATENT DOCUMENTS

2007/0286305 A1* 12/2007 Saggini ................. H04B 3/548
375/272
2014/0357311 A1* 12/2014 Suzuki .................. H04W 52/04
455/522
(Continued)

FOREIGN PATENT DOCUMENTS

DE 102008046737 A1 3/2010
JP 2004150892 A * 5/2004

OTHER PUBLICATIONS

English translation of Written Opinion for International Application No. PCT/DE2018/200007, dated May 4, 2018, 5 pages.
(Continued)

*Primary Examiner* — Dong-Chang Shiue
(74) *Attorney, Agent, or Firm* — RatnerPrestia

(57) ABSTRACT

A compensator for compensating line or coupling losses of a signal transmission path for transmitting a communication signal between an antenna and an electronic control unit, including at least one first interface for connecting to the antenna and a second interface for connecting to the electronic control unit, and which is furthermore notable in that, in addition to the communication signal, the compensator is configured to output a position signal for position determination. An electronic circuit arrangement for operating at least one antenna and an antenna device is also disclosed.

14 Claims, 2 Drawing Sheets

(51) Int. Cl.
  *H04B 17/20* (2015.01)
  *H02J 13/00* (2006.01)
  *G01S 19/13* (2010.01)
  *H04B 1/3877* (2015.01)
  *H04J 3/06* (2006.01)

(52) U.S. Cl.
  CPC ......... *H04B 1/3877* (2013.01); *H04B 17/102* (2015.01); *H04B 17/20* (2015.01); *H04J 3/0638* (2013.01); *H03F 2200/165* (2013.01); *H03F 2200/294* (2013.01)

(58) Field of Classification Search
  CPC .. H04J 3/0638; G01S 19/13; H03F 2200/294; H03F 2200/165
  See application file for complete search history.

(56) References Cited

U.S. PATENT DOCUMENTS

| | | | |
|---|---|---|---|
| 2016/0150451 A1* | 5/2016 | Barreto De Miranda Sargento .... | H04W 36/14 370/332 |
| 2016/0269078 A1* | 9/2016 | Mitchell | H04B 3/542 |
| 2017/0019360 A1 | 1/2017 | Sokolov et al. | |
| 2018/0159599 A1* | 6/2018 | Sattinger | H04W 52/54 |
| 2018/0233816 A1* | 8/2018 | Barber | H01Q 1/44 |

OTHER PUBLICATIONS

International Search Report and Written Opinion for International Application No. PCT/DE2018/200007, dated May 4, 2018—7 pages.

\* cited by examiner

COMPENSATOR, ELECTRONIC CIRCUIT ASSEMBLY FOR OPERATING AN ANTENNA, AND ANTENNA DEVICE

CROSS REFERENCE TO RELATED APPLICATIONS

This application is the U.S. National Phase Application of PCT International Application No. PCT/DE2018/200007, filed Feb. 7, 2018, which claims priority to German Patent Application No. 10 2017 202 341.4, filed Feb. 14, 2017, the contents of such applications being incorporated by reference herein.

FIELD OF THE INVENTION

The present invention relates to a compensator for compensating line or coupling losses of a signal transmission path, an electronic circuit arrangement for operating an antenna and an antenna device.

BACKGROUND OF THE INVENTION

Vehicle-to-X communication (V2X) on the basis of IEEE 802.11p is currently being launched onto the market. Position detection by means of a global navigation satellite system (GNSS) is known. An electronic control unit for vehicle-to-X communication (V2X ECU) is conventionally connected to a vehicle bus, e.g. Flexray or Ethernet, via which it is frequently possible to obtain an absolute position (GNSS position) of the GNSS and time synchronization can take place.

This prior art is disadvantageous in that information relating to the absolute position (GNSS position) is not provided via the bus in all vehicle models. However, there is a need to enable the use of identical electronic control units (ECU) for vehicle-to-X communication in as many different vehicle models as possible.

SUMMARY OF THE INVENTION

An aspect of the invention aims to provide a solution whereby information relating to an absolute position can be obtained and which enables electronic control units which are as similar as possible to be used for different requirements.

An aspect of the invention describes a compensator for compensating line or coupling losses of a signal transmission path for transmitting a communication signal between an antenna and an electronic, including at least one first interface for connecting to an antenna and a second interface for connecting to an electronic control unit, wherein, in addition to the communication signal, the compensator is configured to output a position signal for position determination and/or a synchronization signal for time synchronization.

This aspect is based on the idea that a compensator for introduction into a signal transmission path between an antenna and an electronic control unit can also output position signals in addition to the communication signals to be transmitted, whereby position information is also present if it cannot be obtained in another manner, for example via a vehicle bus. With comparatively few different components, the application can therefore be advantageously supported by an aspect of the invention in a wide variety of vehicle models, wherein it is simply necessary to implement an adaptation of parameters and/or software to the different vehicle models, where appropriate. The communication signals to be transmitted refer to signals of vehicle-to-X communication or, in particular, a high-frequency signal, also known as an HF signal or RF signal. The first interface and/or the second interface correspondingly refers to a high frequency plug connector, for example a coaxial plug connector.

The compensator is particularly preferably configured to output the position signal and/or the synchronization signal via the second interface. Therefore, for the transmission of the position signal and the communication signal, in particular to an electronic control unit for processing said signals, it is merely necessary to provide an interface and line. Alternatively or in addition to this, a separate interface for transmitting the position signal, in particular to an electronic control unit and/or a data bus of a vehicle, can be provided.

The compensator preferably has a modulation device, which is configured to modulate the position signal and/or the synchronization signal onto a carrier for output. In particular, for the output of the position signal and/or the synchronization signal via the second interface, the compensator is designed to modulate the position signal and/or the synchronization signal onto a carrier to be transmitted via the second interface. Suitable electrical oscillations which are preferably present in the compensator and/or generated therein can preferably be used as carriers. It is preferable to provide a clock which is included in the compensator and whereof the signal can be used as a carrier. It is provided that, to realize the relevant modulation, the compensator includes at least one modulation device, in particular a remote power supply module or bias tee.

According to a further development, the compensator is designed to modulate a clock signal with the position signal and/or to modulate the communication signal with the position signal and/or to modulate a supply voltage of a voltage supply of the compensator with the position signal and/or to modulate the position signal with the clock signal and/or the communication signal. The position signal and the relevant further signal can therefore be advantageously transmitted simultaneously via the second interface. The modulated signals to be transmitted can moreover be transmitted simultaneously together, in particular to an electronic control unit, by means of a single coaxial line or by means of a line pair of a twisted-pair line.

The compensator can preferably also be designed to modulate a clock signal with the synchronization signal and/or to modulate the communication signal with the synchronization signal and/or to modulate a supply voltage of a voltage supply of the compensator with the synchronization signal and/or to modulate the synchronization signal with the clock signal and/or the communication signal.

It can moreover preferably be provided that the compensator is configured to modulate the synchronization signal with the position signal or to modulate the position signal with the synchronization signal.

The compensator is preferably configured to use a defined frequency and/or defined pulse parameter for the transmission of the position signal and/or the synchronization signal in each case, in particular a minimum or maximum rise time of a pulse and/or a minimum or maximum pulse amplitude.

According to a preferred embodiment, the compensator includes at least one functional assembly of a GNSS receiver for receiving signals of navigation satellites of a global navigation satellite system and outputting a GNSS signal for position determination and/or a synchronization signal for time synchronization. GNSS receivers frequently include, for example, at least one GNSS antenna and pre-processing and processing electronics. According to an aspect of the invention, at least one of the functional assemblies of a GNSS receiver is to be provided as included in the compensator. According to a preferred embodiment, the compensator includes all functional assemblies for realizing a GNSS receiver, i.e. accordingly, also a GNSS antenna.

According to a preferred embodiment of an aspect of the invention, a third interface is included for the connection of at least one functional assembly of a GNSS receiver for receiving signals of navigation satellites of a global navigation satellite system. In particular when the compensator does not include all functional assemblies for realizing a GNSS receiver, it is provided according to a further development that functional assemblies for realizing the GNSS receiver are connected to the compensator by means of the third interface. This relates in particular to a GNSS antenna and, where appropriate, pre-processing electronics, such as amplifier and/or filter electronics, for example. It can also be provided to connect a GNSS receiver, including substantially all functional assemblies for realizing this, to the compensator via the third interface. Accordingly, the third interface preferably refers to a high-frequency plug connector, for example a coaxial plug connector.

It can be expediently provided that the compensator is configured to undertake pre-processing of a GNSS signal provided by the GNSS receiver before the position signal is output via the second interface.

The position signal is preferably derived from the GNSS signal by pre-processing, for example by the GNSS receiver. This can be, for example, data reduction and/or filtering. If it is provided that such processing is to be carried out by an electronic control unit which is contacted at the second interface, the compensator is configured for outputting the GNSS signal as a position signal via the second interface.

The compensator is preferably configured to be supplied with a supply voltage of a voltage supply via the second interface. According to a further development, the compensator includes a module for supplying the compensator with a supply voltage or, in other words, a module for remote power supply of the compensator, in particular a bias tee. In particular, owing to the widely corresponding operating principle, the remote power supply module and the modulation device can be provided as a common functional assembly.

The GNSS receiver is preferably configured for providing a synchronization signal for time synchronization, in particular a 1PPS signal, wherein the compensator is configured to output the synchronization signal via the second interface. Alternatively or in addition to this, the separate interface can be provided for delivering the position signal, in particular to an electronic control unit and/or a data bus of a vehicle.

For transmission via the second interface, the compensator is preferably configured to modulate the 1PPS signal onto a carrier. In other words, the carrier is modulated with the 1PPS signal. All oscillations present in the electronic circuit, in particular a signal of a clock, can be used as carriers. The compensator is preferably configured to use a defined frequency or frequency band for transmitting the synchronization signal.

Alternatively, the modulation of the position signal and/or the synchronization signal onto the voltage supply preferably takes place by triggering a comparatively brief increase in the current requirement (current pulse) of the compensator. The compensator therefore includes at least a functional assembly for triggering an increased current requirement of the compensator.

The compensator preferably has a switch device for connecting a load for increasing the current requirement of the compensator, wherein the current requirement can be modulated according to a signal to be transmitted via the second interface. A modulation of the communication signal and/or the position signal and/or the synchronization signal onto the supply voltage can therefore be advantageously realized. The load is, in particular, a resistive or capacitive load. The switch device is, for example, a transistor, e.g. bipolar transistor. It is preferably provided to trigger a comparatively brief increase in the current requirement (current pulse) of the compensator by means of the switch device. In this case, the current pulse to be generated is expediently such that it can be discernibly differentiated from other current flows of the compensator operation. This can take place, for example, by adapting the amplitude of the current pulse on the one hand and/or by the rise time of the pulse. The load is preferably likewise included by the compensator.

According to one embodiment, the switch device is preferably arranged downstream or upstream of the remote power supply module of the compensator, relative to the voltage supply path.

The compensator expediently has a polarity protection diode. The connection of the switch device and accordingly the load for the supply voltage modulation is preferably provided between the anode of the polarity protection diode and the remote power supply module of the compensator. Decoupling of backup capacitors of the remaining voltage supply of the compensator is therefore realized and a current pulse with a comparatively brief rise time can be generated.

According to an advantageous embodiment, the compensator can include at least one splitter/combiner. The splitter can be realized for example as a Wilkinson splitter or microstrip directional coupler, likewise the combiner, although, in this case, the push-pull components of the signals cancel each other out, which can be accepted in the case of independent signal sources. It is therefore possible to operate a plurality of antennas by means of a compensator, which is then particularly advantageous if an associated electronic control unit does not have sufficient connections for a required number of antennas. This in turn enables the assignment of the compensator according to an aspect of the invention for use in a wide variety of vehicle models.

At least the first interface and/or the second interface of at least one embodiment of the compensator according to an aspect of the invention are preferably configured to support at least one IEEE 802.11 standard, preferably IEEE 802.11p.

An aspect of the invention furthermore describes an electronic circuit arrangement for operating at least one antenna, in particular for vehicle-to-X communication, which has at least one embodiment of a compensator according to an aspect of the invention and an electronic control unit, connected to the compensator via the second interface, for processing information of radio communication, in particular vehicle-to-X communication, which is to be sent and received by means of at least one antenna. The electronic control device is preferably connected to the second interface of the compensator via at least one high frequency line, for example a coaxial cable. Accordingly, the first interface and/or the second interface and/or the third interface are preferably high frequency plug connectors, for example coaxial plug connectors. The connections of the first interface to the antenna and/or the second interface to the electronic control unit and/or, where appropriate, the third interface to at least one functional assembly of a GNSS receiver can preferably be implemented directly or indirectly here, i.e. via further modules, for example.

According to an aspect of the invention, it can be provided that the compensator and the electronic control unit are included in a common housing or are each included in a separate housing, wherein these can be provided such that they are spatially separated or adjacent to one another.

It the compensator is connected to a voltage supply via the second interface and accordingly has a module for supplying a supply voltage, it is expediently provided that the circuit arrangement has, in addition to the remote power supply module of the compensator, a module associated with the electronic control unit or a module included in the electronic control unit for supplying the compensator with a supply voltage, in particular a bias-tee, via the second interface (remote power supply). The module associated with the electronic control unit is preferably included in the electronic control unit and can accordingly be realized in the same housing or on the same printed circuit board. It can alternatively be provided that this module is realized spatially separately from the electronic control unit.

The electronic control unit is configured to receive and to process the position signal and/or the synchronization signal and/or the communication signal. In particular, the electronic control unit is configured such that it can separate a respective useful signal and carrier signal, in particular when these are transmitted simultaneously by means of the second interface. If it is provided, for example, that the clock signal, as a carrier signal, is modulated with the position signal as a useful signal—in other words, it is provided that the position signal is modulated onto the clock signal—the electronic control unit has functional assemblies for the separation and the separate processing of the common signal. The electronic control unit can also have functional assemblies for realizing the modulations.

The circuit arrangement and/or the compensator, in particular the electronic control unit, preferably include at least one pulse detector. The use of coaxial cables requires a relatively high line capacitance, whereby the generated current pulse is smoothed again to a limited extent. Detection of the signal modulated onto the supply voltage can be implemented by a suitable pulse detector.

A proportional discriminator (constant fraction discriminator; CFD) for generating substantially exact time marks from pulses of different signal amplitudes is preferably provided as the pulse detector. Improved time resolution or a low jitter can thus be achieved. In particular, in relatively short lines, threshold discriminators or combinations of filters and threshold discriminators can be alternatively or additionally used.

When using a plurality of compensators for the circuit arrangement, it can be provided that at least one compensator is provided with a GNSS receiver according to an aspect of the invention and at least one compensator is configured without a GNSS receiver, wherein the at least one further compensator can be configured as a simple compensator with an input and an output and/or as a double compensator with splitter/combiner, having two inputs and one output.

The electronic control unit is preferably configured to carry out a check during operation as to whether, and/or by means of which signal input, the position signal and/or synchronization signal are obtained. For example, it can therefore be established whether these signals are obtained via a vehicle bus or via a compensator according to an aspect of the invention.

A compensator can expediently therefore be designed without a GNSS receiver so that, according to an aspect of the invention, it modulates a signal for announcing that a position signal cannot be transmitted and therefore provided to the electronic control unit.

An aspect of the invention furthermore describes an antenna device for radio communication, in particular vehicle-to-X communication, including an electronic circuit arrangement according to at least one of the preceding embodiments and at least one antenna connected to the compensator via the first interface.

BRIEF DESCRIPTION OF THE DRAWINGS

Several particularly advantageous configurations of aspects of the invention are described in the subclaims. Further preferred embodiments are revealed in the description below of exemplary embodiments with reference to figures. Configurations of aspects the invention can enable efficient contacting.

In a schematic drawing, the figures show.

DETAILED DESCRIPTION OF THE PREFERRED EMBODIMENTS

Figure 1:
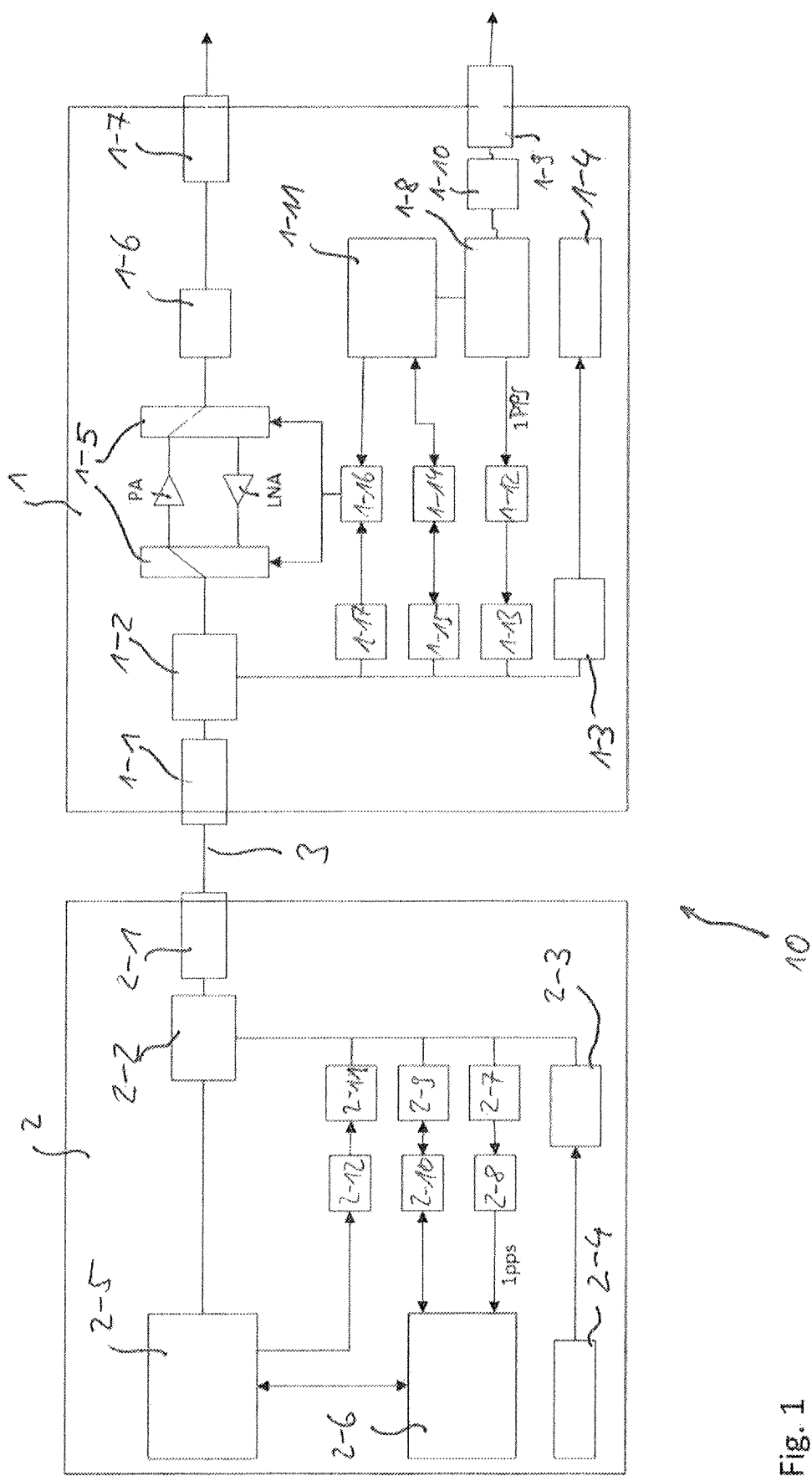
FIG. 1 an exemplary embodiment of the electronic circuit arrangement according to an aspect of the invention for operating an antenna, including an embodiment of the compensator according to an aspect of the invention, and FIG. 2 an exemplary embodiment for realizing a modulation of the supply voltage of the electronic circuit arrangement according to an aspect of the invention using the example of the 1PPS signal.

FIG. 1 shows an exemplary embodiment of the electronic circuit arrangement 10 according to an aspect of the invention for operating an antenna. The circuit arrangement includes a preferred embodiment of the compensator 1 according to an aspect of the invention and an electronic control unit 2. The compensator 1 and the electronic control unit 2 are connected by means of a coaxial line 3 and corresponding coaxial plug connectors 1-1 and 2-1. The compensator 1 and the electronic control unit 2 each have a remote power supply module 1-2 and 2-2, so-called bias tees. By means of these modules, it is possible to realize a superimposition of a communication signal, which is to be transmitted via the coaxial line 3 and is received or is to be sent by means of the antenna (not illustrated), onto a supply voltage so that the coaxial line 3 can be simultaneously used for the voltage supply of the compensator 1. The remote power supply module 2-2 of the electronic control unit is connected to a voltage supply, for example of a vehicle battery, which is depicted via block 2-4. Moreover, according to this exemplary embodiment, an alternating voltage filter 2-3 is provided, whereby retroactive interferences can be prevented by superimposing the high frequency of the communication signals onto the supply voltage. On the side of the compensator, a comparable alternating voltage filter 1-3 is likewise provided. The block 1-4 shows that an energy supply to the functional assemblies of the compensator 1 is realized by means of the supply voltage.

The signal path associated with the remote power supply module 1-2 for transmitting the communication signals of the compensator 1 which are received or to be sent by means of an antenna includes the changeover switch 1-5 for selecting a send or receive path, wherein the send path has, for example, a current amplifier PA and the receive path has a low-noise amplifier LNA. A filter 1-6, for example a bandpass filter, is furthermore provided for filtering possibly interfering voltages with frequencies outside a frequency range of the communication signals. For example, a direct voltage component of the supply voltage can therefore be filtered. A coaxial plug connector 1-7 forms an interface for connection of an antenna to the compensator 2, wherein the antenna can be connected accordingly by means of a coaxial line (not illustrated). For processing communication signals which are to be sent and are received, the electronic control unit 2 has a corresponding processing unit 2-5 and electronic computational unit 2-6.

The compensator according to the example furthermore has processing electronics 1-8 of a GNSS receiver, wherein a GNSS antenna (not illustrated) can be connected via coaxial plug connectors 1-9. Possible further functional assemblies for pre-processing the GNSS signals obtained from a GNSS antenna, for example amplifier or filter, are represented by block 1-10.

The processing electronics 1-8 output a 1PPS signal for time synchronization of the electronic control unit 2. To transmit the 1PPS signal by means of the coaxial line 3 to the electronic control unit 2, it is converted into a form for transmission by means of a conversion module 1-12 and filter module 1-13, for example modulated as a signal of a defined frequency onto a clock signal of a clock of the compensator. To evaluate the 1PPS signal, the electronic control unit 2 has a filter module 2-7 for filtering the signal of a defined frequency and a conversion device 2-8. Based on the defined frequency or pulse amplitude or pulse rise time, the modulated 1PPS signal can be extracted by means of the filter module 2-7 and, after it has been converted by the conversion device 2-8 into a signal which can be used by the electronic computational unit 2-6, it can be processed by the electronic computational unit 2-6.

The evaluation electronics 1-8 output a position signal to an electronic computational unit 1-11. In a manner comparable to that already described for the 1PPS signal, for transmission to the electronic control unit 2, the position signal, which is preferably output by a serial digital interface of the evaluation electronics 1-8, firstly undergoes conversion into a signal of a defined frequency and modulation of the signal onto a carrier, in particular an existing signal of a clock (not illustrated), by means of the conversion module 1-14 and filter module 1-15. Signals transmitted in such a way can be extracted on the side of the electronic control unit 2 by means of the module 2-9 and converted by means of the conversion module 2-10 into a form which can be processed by the electronic computational unit 2-6. According to the exemplary embodiment, data from the electronic control unit 2 can also be provided to the electronic computational unit 1-11 via this path. For this purpose, the filter module 1-15 is configured to extract a corresponding signal of a defined frequency from the electronic control unit 2 and to convert it by means of the conversion module 1-14 into a form which can be processed by the electronic computational unit 1-11.

The electronic computational unit 1-11 furthermore outputs a signal for controlling the changeover switch 1-5 for selecting the send or receive path, wherein the conversion module 1-16 generates the corresponding control signals from the signal provided by the electronic computational unit 1-11. Such a signal for controlling the changeover switch 1-5 can be output by the processing device 2-5 of the electronic control unit 2, converted into a signal of a defined frequency by means of the conversion module 2-12 and filter module 2-11 and modulated onto a clock signal by means of. The extraction of the signal and transmission to the conversion module 1-16 takes place by means of the filter module 1-17. A summation of the signals to be transmitted via the line 3 preferably takes place in the remote power supply module.

Figure 2:
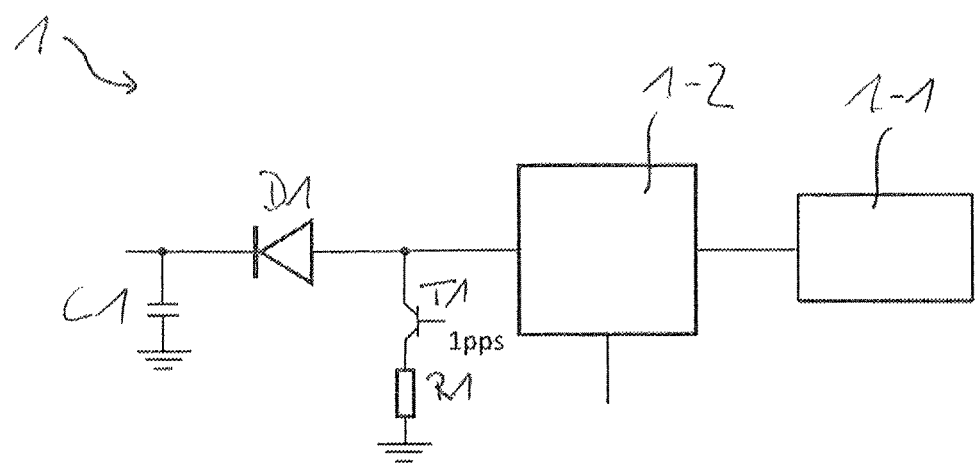

FIG. 2 shows a detail of an exemplary embodiment for realizing a modulation of the supply voltage of the electronic circuit arrangement 10 according to an aspect of the invention on the side of the compensator 1 using the example of the 1PPS signal. With such a realization, it is advantageously possible to generate current pulses which have comparatively brief rise times and moreover still attain comparatively high current values. Such a circuit arrangement can be included in the electronic control unit.

As already described with reference to the exemplary embodiment relating to FIG. 1, the compensator includes a remote power supply module 1-2 and coaxial plug connector 1-1.

According to the exemplary embodiment, a bipolar transistor T1 for connecting a pull-down resistor R1 for increasing the current requirement of the compensator 1 is provided in the path of the supply voltage. As the input signal, the 1PPS signal, which is output by the conversion module 1-12, is supplied to the base of the transistor T1. It is therefore advantageously possible to realize a modulation of the supply voltage with the communication signal and/or the position signal and/or the 1PPS signal for transmission via the line 3.

Through the use of a polarity protection diode D1 in the voltage supply path between the transistor T1 or resistor R1 and backup capacitor C1, decoupling of the backup capacitor C1 from the remaining voltage supply of the compensator 1 can be realized and current pulses with a comparatively brief rise time can be generated.

Should it emerge during the course of the method that a feature or a group of features is not absolutely necessary, it is already the aim of the applicant to formulate at least an independent claim which no longer comprises the feature or the group of features. This can be, for example, a sub-combination of a claim present on the filing date or a sub-combination of a claim present on the filing date which is restricted by further features. Such claims or combinations of features which are to be newly formulated should be regarded as also being covered by the disclosure of this application.

It should furthermore be pointed out that configurations, features and variants of aspects of the invention which are described in the various embodiments or exemplary embodiments and/or shown in the figures can be combined with one another as required. Single or multiple features can be interchanged as required. Combinations of features arising therefrom should also be regarded as being covered by the disclosure of this application.

Back-references in dependent claims should not be regarded as a waiver from achieving independent substantive protection for the features of the subclaims to which back-reference is made. These features can also be combined with other features as required.

Features which are disclosed only in the description or features which are disclosed in the description or in a claim only in conjunction with other features can essentially be of independent significance to an aspect of the invention. They can therefore also be individually incorporated in claims for the purpose of distinction from the prior art.

It should be noted in general that vehicle-to-X communication is understood to mean, in particular, direct communication between vehicles and/or between vehicles and infrastructure devices. For example, this can therefore refer to vehicle to-vehicle communication or vehicle to-infrastructure communication. Insofar as reference is made to communication between vehicles within the framework of this application, this can essentially take place, for example, within the framework of vehicle-to-vehicle communication which typically takes place without relaying via a mobile network or a similar external infrastructure and which should therefore be distinguished from other solutions which build, for example, on a mobile network. Vehicle-to X communication can take place, for example, using the IEEE 802.11p or IEEE 1609.4 standards. Vehicle-to-X communication can also be referred to as C2X communication. The subareas can be referred to as C2C (car-to-car) or C2I (car-to-infrastructure). However, aspects of the invention do not explicitly exclude vehicle-to-X communication with relaying, for example, via a mobile network.

The invention claimed is:

1. A compensator for compensating line or coupling losses of a signal transmission path between a communication antenna and an electronic control unit, including:
   at least one first interface for connecting to the communication antenna that is configured to transmit or receive a raw communication signal;
   a second interface including an electrical conductor for connecting to an electronic control unit; and
   a third interface for connecting to a global navigation satellite system (GNSS) antenna, wherein, the compensator is configured to:
      receive a power supply voltage from the electronic control unit through the electrical conductor of the second interface,
      power a GNSS receiver of the compensator with the power supply voltage, receive, by the GNSS receiver, from the GNSS antenna through the third interface, a raw GNSS position signal for determining the position of the electronic control unit and a raw GNSS synchronization signal for time synchronization of the electronic control unit,
      create a plurality of modulated signals, by:
         modulating the raw communication signal onto a first carrier at a first frequency without converting the raw communication signal to a digital communication format,
         converting the raw GNSS position signal into a digital communication format and modulating the converted position signal onto a second carrier at a second frequency,
         modulating the raw synchronization signal onto a third carrier at a third frequency without converting the raw synchronization signal to a digital communication format, the raw synchronization signal for synchronizing utilized by the electronic control unit to synchronize data extracted from the raw communication signal,
      output the plurality of modulated signals to the electronic control unit through the electrical conductor of the second interface by superimposing the plurality of modulated signals onto the power supply voltage,
      receive, through the electrical conductor, a raw changeover instruction signal modulated and superimposed on the power supply voltage by the electronic control unit without converting the raw changeover signal to digital communication format, the raw changeover instruction signal instructing the compensator to switch between transmitting and receiving data via the communication antenna, and
      in response to receiving the raw changeover instruction signal, control a changeover switch of the compensator to switch between transmitting and receiving via the communication antenna,
   wherein the electrical conductor simultaneously provides the power supply voltage from the electronic control unit to the compensator and outputs at least one of the plurality of modulated signals to the electronic control unit, and
   wherein the electronic control unit uses the raw GNSS synchronization signal to synchronize in time, the determined position of the electronic control unit with data extracted from the raw communication signal received.

2. The compensator according to claim 1, wherein the compensator has at least one modulation device, which is configured to modulate the position signal and/or the synchronization signal onto a carrier for output.

3. The compensator according to claim 2, wherein at least one functional assembly for triggering an increased current requirement of the compensator, in particular including a switching device for connecting a load, is provided, wherein the current requirement can be modulated according to a signal to be transmitted via the second interface.

4. The compensator according to claim 2, wherein the compensator has at least one modulation device which is configured to modulate the position signal and/or the synchronization signal onto a carrier to be transmitted via the second interface for output via the second interface.

5. The compensator according to claim 1, wherein the compensator has at least one modulation device which is configured to modulate the position signal and/or the synchronization signal onto a carrier to be transmitted via the second interface for output via the second interface.

6. The compensator according to claim 1, wherein the compensator is designed to modulate a clock signal with the position signal and/or to modulate the communication signal with the position signal and/or to modulate a supply voltage of a voltage supply of the compensator with the position signal and/or to modulate the position signal with the clock signal and/or the communication signal.

7. The compensator according to claim 1, wherein the compensator is designed to modulate a clock signal with the synchronization signal and/or to modulate the communication signal with the synchronization signal, and/or to modulate a supply voltage of a voltage supply of the compensator with the synchronization signal and/or to modulate the synchronization signal with the clock signal and/or the communication signal.

8. The compensator according to claim 1, wherein, for the transmission of the position signal and/or the synchronization signal, the compensator is configured to use a substantially defined frequency and/or defined pulse parameters in each case.

9. The compensator according to claim 1, wherein the compensator includes at least one functional assembly of a GNSS receiver for receiving signals of navigation satellites of a global navigation satellite system and outputting a GNSS signal for position determination and/or synchronization signal for time synchronization.

10. The compensator according to claim 1, wherein the compensator includes a third interface for the connection of at least one functional assembly of a GNSS receiver for receiving signals of navigation satellites of a global navigation satellite system.

11. The compensator according to claim 1, wherein the compensator includes a module for remote power supply and is configured to be supplied with a supply voltage of a voltage supply via the second interface.

12. The compensator according to claim 1, wherein the GNSS receiver is configured for providing a synchronization signal for time synchronization, wherein the compensator is configured to output the synchronization signal via the second interface.

13. An electronic circuit arrangement for operating at least one antenna, including at least one compensator according to claim 1 and an electronic control unit connected to the compensator via the second interface.

14. An antenna device for radio communication, including an electronic circuit arrangement according to claim 13 and an antenna connected to the compensator via the first interface.

* * * * *